(12) United States Patent
Tachibana et al.

(10) Patent No.: US 7,893,542 B2
(45) Date of Patent: Feb. 22, 2011

(54) CONNECTING STRUCTURE FOR FLIP-CHIP SEMICONDUCTOR PACKAGE, BUILD-UP LAYER MATERIAL, SEALING RESIN COMPOSITION, AND CIRCUIT BOARD

(75) Inventors: Kenya Tachibana, Utsunomiya (JP); Masahiro Wada, Utsunomiya (JP); Takuya Hatao, Utsunomiya (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 225 days.

(21) Appl. No.: 12/309,110
(22) PCT Filed: Mar. 28, 2008
(86) PCT No.: PCT/JP2008/056069
§ 371 (c)(1), (2), (4) Date: Jan. 7, 2009

(87) PCT Pub. No.: WO2008/123414
PCT Pub. Date: Oct. 16, 2008

(65) Prior Publication Data
US 2009/0273073 A1 Nov. 5, 2009

(30) Foreign Application Priority Data
Mar. 30, 2007 (JP) ............................. 2007-092937

(51) Int. Cl.
H01L 23/29 (2006.01)
(52) U.S. Cl. ........................ 257/778; 257/692; 257/686; 257/774; 257/700; 257/777
(58) Field of Classification Search .................. 257/778, 257/692, 686, 774, 700, 777
See application file for complete search history.

(56) References Cited
FOREIGN PATENT DOCUMENTS

| JP | 11-233571 | 8/1999 |
| JP | 2001-35960 | 2/2001 |
| JP | 2003-82061 | 3/2003 |
| JP | 2004-71656 | 3/2004 |
| JP | 2004-134679 | 4/2004 |
| JP | 2006-24842 | 1/2006 |
| JP | 2006-316250 | 11/2006 |

OTHER PUBLICATIONS

International Search Report.
PCT Notification Concerning Transmittal of international Report on Patentability (Form PCT/IB/326) mailed Oct. 15, 2009.
PCT Notification of Transmittal of Translation of the International Preliminary Examination Report (Form PCT/IB/338) mailed on Oct. 22, 2009.
PCT International Preliminary Report on Patentability (Form PCT/IB/373) issued Oct. 6, 2009 and Oct. 13, 2009.
PCT Written Opinion of the International Searching Authority (Form/ISA/237) mailed on Oct. 22, 2009.

*Primary Examiner*—Long Pham
(74) *Attorney, Agent, or Firm*—Smith, Gambrell & Russell, LLP (57) ABSTRACT

The invention provides a connecting structure for a flip-chip semiconductor package in which cracking and delamination are inhibited or reduced to improve reliability, and in which the potential range of designs is expanded for the inner circuitry of circuit boards and the inductance is reduced. The invention is a connecting structure for a flip-chip semiconductor package, including: a circuit board having a core layer and at least one build-up layer; a semiconductor element connected via metal bumps to the circuit board; and a sealing resin composition with which gaps between the semiconductor element and circuit board are filled, wherein a cured product of the sealing resin composition has a glass transition temperature between 60° C. and 150° C. and a coefficient of linear expansion from room temperature to the glass transition temperature being between 15 ppm/° C. and 35 ppm/° C., a cured product of the build-up layer has a the glass transition temperature of at least 170° C. and a coefficient of linear expansion in the in-plane direction up to the glass transition temperature being not more than 40 ppm/° C., and stacked vias are provided in the build-up layer on at least one side of the core layer.

11 Claims, 1 Drawing Sheet

CONNECTING STRUCTURE FOR FLIP-CHIP SEMICONDUCTOR PACKAGE, BUILD-UP LAYER MATERIAL, SEALING RESIN COMPOSITION, AND CIRCUIT BOARD

TECHNICAL FIELD

The present invention relates to a semiconductor package, and in particular to a flip-chip semiconductor package.

BACKGROUND ART

Recent demand for lighter and thinner high-performance electronic devices has led to electronic devices with higher density integration and higher density packaging, and the semiconductor packages used in such electronic devices are becoming ever smaller than in the past.

Because of the limited ability to reduce the size of semiconductor packages that have a configuration employing conventional lead frames, area mounted types of semiconductor packages such as ball grid arrays (BGA) and chip scale packages (CSP) comprising semiconductor elements mounted on circuit boards have recently been proposed. In these semiconductor packages, known ways to connect semiconductor elements mounted on BGA to circuit boards include wire bonding, TAB (tape automated bonding), and flip-chip (FC) methods, but an abundance of BGA or CSP structures employing flip-chip connecting methods useful for the miniaturization of semiconductor packages have recently been proposed.

The flip-chip connecting method of mounting is thought to be more advantageous than wire bonding methods because less area is needed for mounting. Flip-chip, mounting is also characterized by good electrical properties because the circuit wiring is shorter. Flip-chip mounting is an excellent connecting method for the circuits of portable devices which, due to strong demand, need to be made smaller and thinner, high frequency circuits which are highly regarded for their electrical properties, and so forth.

In flip-chip mounting, interposers that have a core layer and a build-up layer are generally used to connect semiconductor elements. In the interposers, the need to handle even higher density packaging and to meet demand for faster operating frequencies has resulted in the proposal of a thin build-up interpose, wherein a smaller overall interposer thickness and a shorter interlayer connection length for handling higher frequencies are achieved by making a thinner core layer or by dispensing with the core layer altogether and using an interposer that is a laminate in which wiring patterns are formed in resin or the like (Patent Document 1, for example).

Vertical continuous connections in the build-up layers of the interposer, referred to as stacked via connections, are being adopted to handle ever higher frequency transmissions. Stacked vias comprise vias stacked up directly on top of each other in a plurality of stages, allowing the wiring distance to be shortened and thereby effectively reducing inductance (Patent Document 2, for example).

In flip chip-mounted semiconductor packages, the gaps between semiconductor elements and circuit boards are usually filled with a reinforcing resin composition (underfill) to ensure the reliability of the connections between semiconductor elements, circuit boards, and metal bumps, etc. Thermosetting resins such as epoxy resins have been widely used in the past as an underfill material.

In these semiconductor devices, the functioning surfaces of silicon chips are electrically connected to circuit boards through a conductive material oriented toward the circuit board side, and the gaps between the silicon chips and circuit boards are filled with a thermosetting resin composition that is then cured. The thermosetting resin compositions also have $C_{10}$ to $C_{30}$ linear aliphatic hydrocarbon compounds which chemically combine with the thermosetting resin. These have high temperature cycle reliability, yet allow silicon chips to be removed at low temperature and low shear force, without damaging the silicon chips or circuit boards (Patent Document 3, for example).

Patent Document 1: Japanese Patent Application Publication No. 2006-24842A

Patent Document 2: Japanese Patent Application Publication No. 2001-35960A

Patent Document 3: Japanese Patent Application Publication No. 11-233571A

DISCLOSURE OF THE INVENTION

Problem to be Solved by the Invention

However, there is room for the following improvements in the prior art described in the above documents.

First, circuit boards and semiconductor elements have different coefficients of linear expansions. Circuit boards are composed of materials that contain organic resins, and have a greater coefficient of linear expansion than semiconductor elements. The thermal hysteresis of semiconductor packages with a structure comprising semiconductor elements mounted on a circuit board thus leads to warping in the circuit board due to the difference in the coefficient of linear expansion between the two.

The problem of warping also occurs in thin build-up interposers employing a coreless structure with no core member.

Second, the temperature cycle reliability of semiconductor packages varies tremendously depending on the inner layer circuitry structure of the circuit board that is used. Specifically, the reliability varies significantly depending on the number of through holes in the core layer or the number of stacked vias in the build-up layer.

The circuit boards using interposers have stacked via connections, resulting in problems with reliability.

Third, the semiconductor element structural materials and metal bump materials for connecting semiconductors and circuit boards that are used now are different from those used in the past, and there is thus a need to design new underfill that would be suitable for such new materials. Lead-free structural materials for bumps have also entered the mainstream out of concern for the environment.

The damage noted above, such as cracking, becomes more pronounced when lead-free solder is used. The inadequate toughness of lead-free solder also tends to result in cracks at the interface between metal bumps and semiconductor elements or circuit boards.

With the foregoing in view, it is an object of the present invention to overcome drawbacks in the prior art, and in particular to surely inhibit or reduce cracking or delamination so as to improve reliability when circuit boards with stacked vias are used as circuit boards for semiconductor packages, and to expand the potential range of the design for the inner layer circuitry of circuit boards, so as to provide a flip-chip semiconductor package, build-up layer material, and sealing resin composition allowing the connecting wiring length of the inner layer circuitry to be shortened and the inductance to be reduced.

Means for Solving the Problem

The above objects are achieved by the inventions noted in [1] through [11] below.

[1] A connecting structure for a flip-chip semiconductor package, comprising: a circuit board having a core layer and at least one build-up layer; a semiconductor element connected via metal bumps to the circuit board; and a sealing resin composition with which gaps between the semiconductor element and circuit board is filled, wherein a cured product of the sealing resin composition has a glass transition temperature between 60° C. to 150° C., and a coefficient of linear expansion from room temperature to the glass transition temperature being between 15 ppm/° C. and 35 ppm/° C., a cured product of the build-up layer has a glass transition temperature of at least 170° C., and a coefficient of linear expansion in the in-plane direction up to the glass transition temperature being not more than 40 ppm/° C., and stacked vias are provided in the build-up layer on at least one side of the core layer.

[2] The connecting structure for a flip-chip semiconductor package according to [1] above, wherein a resin part of the build-up layer comprises a resin composition including at least one kind selected from the selected from the group consisting of epoxy resins, phenol resins, cyanate resins, triazine resins, bismaleimide resins, polyimide resins, polyamide-imide resins, and benzocyclobutene resins.

[3] The connecting structure for a flip-chip semiconductor package according to [1] or [2] above, comprising the build-up layers having stacked vias on both sides of the core layer.

[4] The connecting structure for a flip-chip semiconductor package according to any one of [1] through [3] above, wherein the core layer has through holes in the core layer.

[5] The connecting structure for a flip-chip semiconductor package according to any one of [1] through [4] above, wherein the core layer has through holes and the through holes and the semiconductor element are connected through the stacked vias of the build-up layer.

[6] The connecting structure for a flip-chip semiconductor package according to any one of [1] through [5] above, wherein the stacked vias of the build-up layer are formed on the through holes of the core layer, and the semiconductor element and circuit board are connected by metal bumps through the stacked vias.

[7] The connecting structure for flip-chip semiconductor packages according to any one of [1] through [6] above, wherein the sealing resin composition is a sealing resin composition comprising at least one epoxy resin, and further comprising a curing agent, silane coupler, and inorganic filler.

[8] The connecting structure for flip-chip semiconductor packages according to any one of [1] through [7] above, wherein the sealing resin composition has a viscosity of not more than 50 Pa·sec (25° C.).

[9] A build-up layer material, characterized by being used in the connecting structure for a flip-chip semiconductor package according to any one of [1] through [8] above.

[10] A sealing resin composition, characterized by being used in the connecting structure for a flip-chip semiconductor package according to any one of [1] through [8] above.

[11] A circuit board, characterized by being used in the connecting structure for a flip-chip semiconductor package according to any one of [1] through [8] above.

Effect of the Invention

The connecting structure for flip-chip semiconductor packages according to the invention has the effect of being able to surely inhibit or reduce cracking or delamination so as to improve reliability when applied to circuit boards with stacked vias, and to expand the potential range of the design for the inner layer circuitry of interposers, so as to allow the connecting wiring length of the inner layer circuitry to be shortened and the inductance of the semiconductor package to be reduced.

Best Mode for Carrying Out the Invention

It is possible to surely inhibit or reduce cracking or delamination caused by the concentration of stress around the boundary interface between semiconductor elements and sealing resin compositions by using a connecting structure for a flip-chip semiconductor package, comprising: a circuit board having a core layer and a build-up layer, a semiconductor element connected via metal bumps to the circuit board, and a sealing resin composition with which gaps between the semiconductor element and circuit board is filled, wherein a cured product of the sealing resin composition has a glass transition temperature between 60° C. and 150° C., and a coefficient of linear expansion from room temperature to the glass transition temperature being between 15 ppm/° C. and 35 ppm/° C., a cured product of the build-up layer has a glass transition temperature of at least 170° C., and a coefficient of linear expansion in the in-plane direction up to the glass transition temperature being not more than 40 ppm/° C., and stacked vias are provided in the build-up layer on at least one side of the core layer.

Embodiments of the flip-chip semiconductor package structure according to the invention are illustrated in detail below with reference to drawings.

<Structure of Semiconductor Package>

Figure 1:
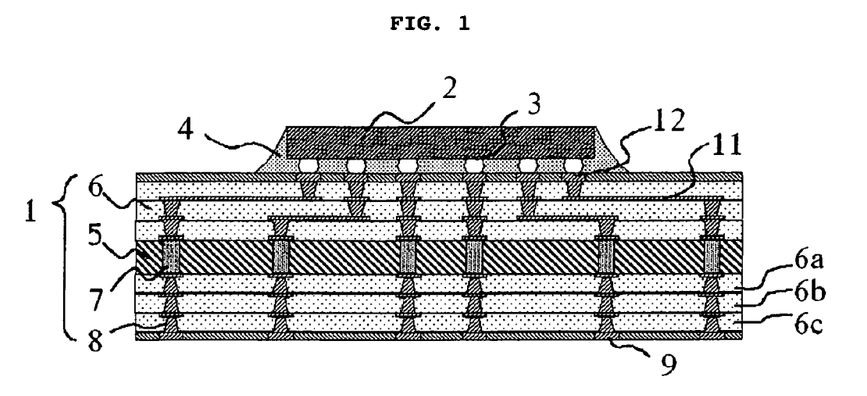
FIG. 1 A schematic cross sectional view illustrating an example of the flip-chip semiconductor package of the invention.

FIG. 1 is a schematic cross section illustrating the structure of a flip-chip semiconductor package in a first embodiment of the invention. In the figure, 1 is a circuit board, and 2 is a semiconductor element arranged on the circuit board, where the thickness ranges, for example, from about 100 μm to 750 μm. The upper surface (electrode surface to be connected to the semiconductor) of the circuit board 1 and the electrode surface on the underside of the semiconductor element 2 are joined in the flip-chip manner by solder balls 3 as metal bumps. A sealing resin composition 4 is then injected between the circuit board 1 and the semiconductor element 2. The inner layer structure of the circuit board 1 comprises a core layer 5 in the middle, with build-up layers 6 stacked above and below the core layer 5. For interconnection in the circuit board 1, the connection between the upper and lower parts in the core layer 5 is secured through holes 7, and the interlayer connection in the build-up layers 6 is secured stacked vias 8. An external connecting terminal 9 is formed on the surface opposite the surface where the chip is mounted, and the external connecting terminal 9 is connected to a mother board.

<Constituent of Sealing Resin Composition>

In FIG. 1, a resin meeting the following properties is used in one embodiment of the sealing resin composition 4.

(1) A resin whose cured product has a glass transition point of 60 to 150° C., and preferably 70 to 115° C., as determined by TMA.

(2) A resin with a coefficient of linear expansion of 15 to 35 ppm/° C., and preferably 20 to 35 ppm/° C., when cured.

The coefficient of linear expansion can be determined, for example, at a heating rate of 10° C./min using a TMA device (mfd. by TA Instruments Co., Ltd.).

The use of a sealing resin composition 4 having these properties will allow differences in the coefficient of linear expansion between the semiconductor element 2 and the sealing resin composition 4 to be reduced, thus making it possible to even more effectively inhibit or reduce cracking or delamination caused by stress concentrated around the boundary interface.

The thermosetting shrinkage percentage of the sealing resin composition 4 is greater than the thermal shrinkage percentage of the circuit board 1 or semiconductor element 2, and warping therefore occurs due to differences between the structural components as a result of changes in the ambient temperature or the like, so that stress becomes concentrated in particular around the boundaries of the structural components and tends to result in cracking. Therefore, a sealing resin composition 4 having a low coefficient of linear expansion and glass transition temperature meeting the above conditions are used to achieve the effect of alleviating thermal stress produced by differences in the coefficient of linear expansion or the like between the sealing resin composition 4 and the circuit board 1 or semiconductor element 2.

In FIG. 1, the sealing resin composition 4 may be a resin including at least one epoxy resin, and also may be one that includes a curing agent, silane coupler, and inorganic filler. Such a sealing resin composition 4 will preferably have better heat resistance, dielectric properties, and the like to help improve reliability, and will preferably lower the elastic modulus or glass transition temperature of the cured product through adjustment of the cross linking density, thereby contributing to the mechanisms for lowering stress noted above.

A more detailed description of the sealing resin composition 4 will be given here. The sealing resin composition 4 is a thermoset resin composition. One embodiment of the invention is a cured product of a liquid epoxy resin composition containing (A) an epoxy resin, (B) curing agent, (C) silane coupler, and (D) inorganic filler. The sealing resin composition 4 may also include (E) other additives as needed in addition to the components (A) through (D) above. The components are described below.

The molecular weight or structure of the epoxy resin (A) used in the sealing resin composition 4 is not particularly limited as long as there are at least 2 epoxy groups per molecule. Examples include Novolak-type epoxy resins, bisphenol-type epoxy resins, aromatic glycidylamine-type epoxy resins, hydroquinone-type epoxy resins, biphenyl-type epoxy resins, stilbene-type epoxy resins, triphenol methane-type epoxy resins, triphenol propane-type epoxy resins, alkyl-modified triphenol methane-type epoxy resins, triazine nucleus-containing epoxy resins, dicyclopentadiene-modified phenol-type epoxy resin, naphthol-type epoxy resins, naphthalene-type epoxy resins, phenol aralkyl-type epoxy resins, naphthol aralkyl-type epoxy resins, and aliphatic epoxy resins.

In this case, those comprising a glycidyl ether structure or glycidylamine structure bonded to an aromatic ring are preferred for the sake of heat resistance, mechanical properties, and moisture resistance. The amount in which aliphatic or alicyclic epoxy resins are used is preferably limited for the sake of reliability, particularly adhesiveness. These may be used singly, or in combinations of two or more. In a preferred embodiment of the sealing resin composition 4 of the invention, the epoxy resins will ultimately be in the form of a liquid at ordinary temperature (25° C.), but epoxy resins that are solids at ordinary temperature may be used as long as they can be dissolved to be turned to liquid epoxy resins at ordinary temperature and as a result they can be in a liquid state.

The molecular weight or structure of the curing agent (B) used in the sealing resin composition 4 is not particularly limited, provided that the curing agent (B) has two or more functional groups per molecule capable of forming covalent bounds with epoxy groups in the epoxy resin, but has one or more acid anhydride groups when the functional groups are acid anhydride groups. Examples of functional groups include phenolic hydroxyl groups, acid anhydride groups, and amino groups, specifically, phenol resins, acid anhydrides, and primary and secondary amines.

The above curing agents may be used either singly or in combinations of two or more containing the same functional groups. Combinations of two or more containing different functional groups may also be used, provided that the pot life or curability of epoxy resin is not thereby compromised. In consideration of semiconductor package sealing applications, phenol resins and aromatic polyamine-type curing agents are preferred for the sake of heat resistance and electrical and mechanical properties. Aromatic polyamine-type curing agents are also preferred as they also provide adhesion and moisture resistance.

The amount in which the curing agent is blended ranges from 0.6 to 1.4, and preferably 0.7 to 1.3, in terms of the epoxy equivalent of the epoxy resin to the active hydrogen equivalent of the curing agent (epoxy equivalent/active hydrogen equivalent). The use of a curing agent having an active hydrogen equivalent outside this range is undesirable as the reactivity or the heat resistance of the composition will be significantly impaired. However, when the functional groups of the curing agent are acid anhydride groups, it can be calculated as containing 2 active hydrogens per one acid anhydride group because two carboxylic acid groups may be derived from one acid anhydride group.

As long as the silane coupler (C) used in the sealing resin composition 4 includes, as its chemical structure, an alkoxy group-bonded silicon atom and a functional group-bonded hydrocarbon moiety per molecule, its molecular weight or structure is not particularly limited. Examples include epoxy silane coupling agents such as 3-glycidoxypropyl trimethoxysilane, 3-glycidoxypropyl triethoxysilane, 3-glycidoxypropylmethyl dimethoxysilane, 3-glycidoxypropylethyl diethoxysilane, and 2-(3,4-epoxycyclohexyl) ethyl trimethoxysilane; acrylate group-bonded silane couplers such as 3-methacryloxypropyl trimethoxysilane, 3-methacryloxypropyl triethoxysilane, 3-methacryloxypropylmethyl dimethoxysilane, 3-methacryloxypropylethyl diethoxysilane, and 3-acryloxypropyl trimethoxysilane; aminosilane coupling agents such as N-aminoethylated aminopropylmethyl dialkoxysilanes, N-aminoethylated aminopropyl trialkoxysilanes, 3-aminopropyl trimethoxysilane, 3-aminopropyl triethoxysilane, N-phenyl-γ-aminopropyl trimethoxysilane, N-phenyl-γ-aminopropyl triethoxysilane, N-phenyl-γ-aminobutyl trimethoxysilane, and N-phenyl-γ-aminobutyl triethoxysilane; latent aminosilane couplers in which the primary amino group of an aminosilane coupler has been protected by reaction with a ketone or aldehyde, such as N-(1,3-dimethylbutylidene)-3-(triethoxysilyl) propylamine and N-(benzylidene)-3-(triethoxysilyl)propylamine; mercapto silane couplers such as 3-mercaptopropyl trimethoxysilane and 3-mercaptopropylmethyl dimethoxysilane; and silane couplers which show the same functions as mercapto silane couplers upon thermal decomposition, such as bis(3-triethoxysilylpropyl) tetrasulfide and bis(3-triethoxysilylpropyl) disulfide.

These silane couplers may also be blended after being hydrolyzed. These may be used either singly or in combinations of two or more thereof. In the present invention, epoxy silane couplers are preferred because of their relatively good adhesion onto the surface of the circuit board and semiconductor package components (solder resist on the circuit board surface, polyimides on silicon chip surfaces, sides of silicone chips). Amino silane couplers, latent amino silane couplers, and mercapto silane couplers are preferred because of their extremely good adhesion with silicon nitride surfaces and polyimides on silicon chip surfaces.

The silane coupler may be blended by any blending method such as integral blending, where the coupler is blended, dispersed, and mixed at the same time that the silica filler is mixed with other materials in the process for producing the resin composition; a master batch method, where the coupler is dispersed and dissolved beforehand in the (A) epoxy resin, (B) aromatic amine curing agent, and/or additives other than silica filler coupler, and then blended with the remaining material; methods in which the coupler chemically modifies beforehand a silica filler surface; or combinations of such methods. More preferably, a master batch method or a combination of a master batch method and a method of modification on a silica surface can provide a uniform resin composition.

Examples of the (D) inorganic filler used in the sealing resin composition 4 include silicates such as talc, fired clay, unfired clay, mica, and glass, oxides such as titanium oxide, alumina, fused silica (silica in the form of fused spheres and fused crushed silica), synthetic silica, and crystalline silica or other silica powders, carbonates such as calcium carbonate, magnesium carbonate, and hydrotalcite, hydroxides such as aluminum hydroxide, magnesium hydroxide, and calcium hydroxide, sulfates or sulfites such as barium sulfate, calcium sulfate, and calcium sulfite, borates such as zinc borate, barium meta-borate, aluminum borate, calcium borate, and sodium borate, and nitrides such as aluminum nitride, boron nitride, and silicon nitride. These inorganic fillers may be used singly or in mixtures thereof. Fused silica, crystalline silica, and synthetic silica powder are preferred because the resin composition can be improved in heat resistance, moisture resistance, strength, and the like.

The shape of the inorganic filler is not particularly limited, but the shape is preferably spherical for the sake of the filling properties. In this case, the mean particle diameter of the inorganic filler is preferably 0.1 to 20 μm, and more preferably 0.2 to 8 μm. A mean particle diameter over the aforesaid lower limit will result in a resin composition with lower viscosity and thus better filling properties, and a mean particle diameter not exceeding the aforesaid upper limit will be less likely to result in clogging by resin when the semiconductor package gaps are filled with the resin composition.

The sealing resin composition 4 may include other additives (E) such as stress-lowering materials, diluents, pigments, flame retardants, surfactants, leveling agents, and defoamers as needed in addition to the above ingredients.

The sealing resin composition 4 may be produced by dispersing and kneading the ingredients, additives, and the like in a device such as a planetary mixer, triple roll, double heat roll, or mortar, and then defoaming the material in a vacuum. To remove volatile components from the raw materials, either beforehand or during the manufacturing stage, a heat treatment may be carried out at a temperature range such as 50° C. to 200° C. which will not result in the decomposition of the ingredients or a reaction between the curing agent and epoxy resin at atmospheric pressure or reduced pressure. The material may be aged for 12 to 96 hours at a temperature of 5° C. to 35° C. during or at the final stages of the dispersion and mixing process.

<Circuit Board>

In FIG. 1, the circuit board 1 is a multi-layered circuit board on which are formed a core layer and at least one build-up layer containing a resin composition, wherein the core layer has through holes, which are conducting parts, and the build-up layer has stacked vias, which are conducting parts.

Characteristics of the build-up layer are that the cured product of the resin part of the build-up layer has a glass transition temperature of at least 170° C., and a coefficient of linear expansion of no more than 40 ppm/° C. up to the glass transition temperature in the in-plane direction. Here, the coefficient of linear expansion in the in-plane direction can be determined, for example, at a heating rate of 10° C./min using a TMA device (mfd. by TA Instruments Co., Ltd.).

If the glass transition temperature of the cured product of the resin part of the build-up layer is under 170° C., significant warping may result upon the return to room temperature after heating in the manufacturing process. The coefficient of linear expansion up to the glass transition temperature is a factor that controls warping in multi-layered circuit boards. The glass transition temperature of the build-up layer is preferable at least 175° C.

If the coefficient of linear expansion of the cured product of the resin part in the build-up layer is greater than 40 ppm/° C., it will be more than double the coefficient of linear expansion of the copper used in most circuits (17 to 18 ppm/° C.), and will cause significant warping. The coefficient of linear expansion up to the glass transition temperature is preferably 10 to 35 ppm ° C./, and more preferably 15 to 30 ppm ° C./.

The elastic modulus of the cured product of the resin part in the build-up layer at room temperature is preferably at least 5 Gpa. The overall rigidity will be higher, and handleability and workability during the production of the semiconductor packages will be better particularly in cases where the thin circuitry of the circuit board is no thicker than 0.5 mm.

The build-up layer is 10 to 60 μm, and preferably 20 to 50 μm thick.

The core layer is preferably no thicker than 500 μm, preferably between 50 μm and 400 μm, and even more preferably between 100 and 300 μm.

Multi-layered circuit boards are composed of a core layer and, for example, 2 to 10 build-up layers. Two to six build-up layers are preferably included.

The surface of the outer layer of the circuit board may be provided with a heat resistant coating layer such as a solder resist to protective the conductors, preserve the insulation, and so forth.

<Core Layer>

The material used for the resin part of the core layer in the circuit board 1 is not particularly limited and any material may be used, provided that the strength will be suitable. Materials that are suitable for use include materials in the form of sheets (referred to as prepregs) obtained by impregnating a fiber base (such as a glass fiber sheet) with a resin composition of at least one or more from among epoxy resins, phenol resins, cyanate resins, triazine resins, bismaleimide resins, polyimide resins, polyamide-imide resins, and benzocyclobutene resins, for example, and then semi-curing it. Particularly suitable are materials in the form of sheets (referred to as prepregs) obtained by impregnating a fiber base (such as a glass fiber sheet) with a resin composition containing cyanate resin, phenol resin, epoxy resin, and inorganic filler and semi-curing it.

<Build-Up Layer>

The material used for the resin part of the build-up layer in the build-up layer is not limited and any material may be used, provided that the strength is suitable and the above conditions for the coefficient of linear expansion and glass transition temperature for the circuit board 1 are met, although it is preferably constituted of a resin composition containing a thermosetting resin. This will allow the heat resistance of the build-up layer to be improved.

A fiber base such as a glass fiber sheet may also be impregnated with the resin composition used for the build-up layer, and the resin composition may be cured as such. The method for impregnating the fiber base with the resin composition is not particularly limited. A build-up layer with a carrier base may also be formed by forming a rein layer composed of the above resin composition on a carrier base.

Examples of thermosetting resins include epoxy resins, phenol resins, cyanate resins, triazine resins, bismaleimide resins, polyimide resins, polyamide-imide resins, benzocyclobutene resins, resins with benzoxazine rings, urea resins, resins with a triazine ring such as melamine resins, unsaturated polyester resins, polyurethane resins, diallyl phthalate resins, and silicone resins.

One of these resins may be used alone, two or more thereof having different weight-average molecular weights may be combined, or one or more kinds thereof may be used in combination with the pre-polymers thereof.

At least one or more of epoxy resins, phenol resins, cyanate resins, triazine resins, bismaleimide resins, polyimide resins, polyamide-imide resins, benzocyclobutene resins, and resins with benzoxazine rings are preferred.

Examples of epoxy resins include bisphenol-type epoxy resins such as bisphenol-A epoxy resins, bisphenol-F epoxy resins, bisphenol E-type epoxy resins, bisphenol S-type epoxy resins, bisphenol Z-type epoxy resins, bisphenol P-type epoxy resins, and bisphenol M-type epoxy resins, Novolak-type epoxy resins such as phenol Novolak-type epoxy resins and cresol Novolak epoxy resins, and epoxy resins such as biphenyl-type epoxy resins, biphenyl aralkyl-type epoxy resins, aryl alkylene-type epoxy resins, naphthalene-type epoxy resins, anthracene-type epoxy resins, phenoxy-type epoxy resins, dicyclopentadiene-type epoxy resins, norbornene-type epoxy resins, adamantane-type epoxy resins, and fluorene-type epoxy resins.

Examples of phenol resins include Novolak-type phenol resins such as phenol Novolak resin, cresol Novolak resins, and bisphenol-A Novolak resins, resole-type phenol resins such as unmodified resole phenol resins, and oil modified resole phenol resins modified, for example, with wood oil, flaxseed oil, walnut oil, and other phenol resins.

Of these, cyanate resins (including pre-polymers of cyanate resins) are preferred. This will allow the coefficient of linear expansion of the build-up layer to be lowered. The build-up layer will also have better electrical properties (low dielectric constant, low dielectric tangent), mechanical strength, and the like.

Cyanate resins can be obtained, for example, through a reaction between a halogenated cyanogen compound and a phenol, and pre-polymerization by heating or the like as needed. Specific examples can include bisphenol-type cyanate resins such as Novolak-type cyanate resin, bisphenol A-type cyanate resin, bisphenol E-type cyanate resin, and tetramethyl bisphenol F-type cyanate resin. Of these, Novolak-type cyanate resin is preferred. This will allow heat resistance to be improved through increased cross linking density, and the flame retardant properties of the resin composition or the like to be improved. That is because the curing reaction is followed by the formation of a triazine ring in Novolak-type cyanate resin. Novolak-type cyanate resin is also believed to have a higher proportion of benzene rings on the structure and to be more susceptible to carbonization.

Novolak-type cyanate resins represented by the following Formula (1) can be used, for example.

[Chemical Formula 1]

(1)

The average repeating units n of Novolak-type cyanate resins represented by Formula (1) above are not particularly limited, but are preferably 1 to 10, and more preferably 2 to 7. If the average repeating units n are under the above-mentioned lower limit, the Novolak-type cyanate resin will tend to crystallize, and will have relatively low solubility in general purpose solvents, which may make it difficult to handle. When the average repeating units n are over the above-mentioned upper limit, the melt viscosity will be too high, and may result in poor build-up layer formability.

The weight-average molecular weight of the above cyanate resin is not particularly limited, but is preferably 500 to 4,500, and more preferably 600 to 3,000. A weight-average molecular weight under the above-mentioned lower limit may result in a cured product of the build-up layer with poor mechanical strength, and tack may develop when the build-up layer is produced, resulting in resin transfer. A weight-average molecular weight over the above-mentioned upper limit may slow down the curing reaction, and may result in poor formability and low peel strength between the layers when used for the formation of a substrate (particularly a circuit board).

The weight-average molecular weight of the cyanate resin or the like can be determined, for example, by GPC (gel permeation chromatography; standard material: calculated in terms of polystyrene).

Although not particularly limited, the cyanate resins, including its derivatives, may be used either singly or in combination of two or more kinds thereof with different weight-average molecular weights, or one or more kinds thereof may be used in combination with the pre-polymers thereof.

The content of the above thermosetting resin is not particularly limited, but is preferably 5 to 50 wt %, and more preferably 10 to 40 wt %, of the total of the resin composition. A content under the above-mentioned lower limit may result in difficulties with the formation of an insulating layer, and a content over the above-mentioned upper limit may lower the strength of the build-up layer.

When a cyanate resin (especially a Novolak-type cyanate resin) is used as the thermosetting resin, it is preferably used in combination with an epoxy resin (substantially halogen-free).

Examples of the above epoxy resins include bisphenol-type epoxy resins such as bisphenol-A epoxy resins, bisphenol-F epoxy resins, bisphenol E-type epoxy resins, bisphenol S-type epoxy resins, bisphenol Z-type epoxy resins, bisphenol P-type epoxy resins, and bisphenol M-type epoxy resins,

Novolak epoxy resins such as phenol Novolak-type epoxy resins and cresol Novolak epoxy resins, aryl alkylene-type epoxy resins such as biphenyl-type epoxy resins, xylylene-type epoxy resins, and biphenyl aralkyl-type epoxy resins, naphthalene-type epoxy resins, anthracene-type epoxy resins, phenoxy-type epoxy resins, dicyclopentadiene-type epoxy resins, norbornene-type epoxy resins, adamantane-type epoxy resins, and fluorene-type epoxy resins.

As the epoxy resins, these can be used either singly or in combination of two or more kinds thereof with different weight-average molecular weights, or one or more kinds thereof may be used in combination with the pre-polymers thereof.

Of these epoxy resins, aryl alkylene-type epoxy resins are particularly preferred. This will allow the solder heat resistance after moisture-absorption and flame retardance to be improved.

The above aryl alkylene-type epoxy resins refer to epoxy resins that have at least one aryl alkylene groups in the repeating units. Examples include xylylene-type epoxy resin and biphenyl dimethylene-type epoxy resin. Of these, biphenyl dimethylene-type epoxy resin is preferred. Biphenyl dimethylene-type epoxy resins can be represented by Formula (2), for example.

[Chemical Formula 2]

(2)

The average repeating units n of the biphenyl dimethylene-type epoxy resins represented by Formula (2) above are not particularly limited but are preferably 1 to 10, and more preferably 2 to 5. If the average repeating units n are under the above-mentioned lower limit, the biphenyl dimethylene-type epoxy resin will tend to crystallize, and will have relatively low solubility in general purpose solvents, which may make it difficult to handle.

Average repeating units n over the above-mentioned upper limit may lower the fluidity of the resin and cause poor formability, etc. A number of average repeating units n within the above range can ensure that a good balance of properties will be obtained.

The content of the epoxy resin is not particularly limited, but is preferably 1 to 55 wt %, and more preferably 5 to 40 wt %, of the total of the resin composition. A content under the above-mentioned lower limit may lower the reactivity of the cyanate resin or lower the moisture resistance of the resulting product, whereas a content over the above-mentioned upper limit may deteriorate the low linear expansion and heat resistance properties.

The weight-average molecular weight of the epoxy resin is not particularly limited, but is preferably 500 to 20,000, and more preferably 800 to 15,000. When the weight-average molecular weight is under the above-mentioned lower limit, tack may develop on the surface of the build-up layer, and a weight-average molecular weight over the above-mentioned upper limit may lower the solder heat resistance. A weight-average molecular weight within the above range can ensure that a good balance of properties will be obtained.

The weight-average molecular weight of the epoxy resin can be determined, for example, by GPC.

The above resin composition will preferably contain a film-forming resin. This will allow the film formability and handleability to be further improved when build-up layers with a carrier base are produced. Examples of film-forming resins include phenoxy-type resins, bisphenol F-type resins, and olefin-type resins. Such film-forming resins, including derivatives thereof, can be used singly or in combination of two or more kinds thereof with different weight-average molecular weights thereof can be used, or one or more kinds thereof may be used with the pre-polymers thereof. Phenoxy-type resins are preferred among them. This will allow the heat resistance and flame retardance to be improved.

The above phenoxy resins are not particularly limited. Examples include phenoxy resins with a bisphenol skeleton such as phenoxy resins with a bisphenol-A skeleton, phenoxy resins with a bisphenol-F skeleton, phenoxy resins with a bisphenol-S skeleton, phenoxy resins with a bisphenol-M skeleton, phenoxy resins with a bisphenol-P skeleton, and phenoxy resins with a bisphenol-Z skeleton, etc., phenoxy resins with a Novolak skeleton, phenoxy resins with an anthracene skeleton, phenoxy resins with a fluorene skeleton, phenoxy resins with a dicyclopentadiene skeleton, phenoxy resins with a norbornene skeleton, phenoxy resins with a naphthalene skeleton, phenoxy resins with a biphenyl skeleton, and phenoxy resins with an adamantane skeleton, etc.

Structures with plural kinds of the above skeletons can be used as the phenoxy resin, and phenoxy resins with different proportions of such skeletons can be used. Several phenoxy resins with different skeletons can also be used, several kinds of phenoxy resins with different weight-average molecular weights can be used, and their pre-polymers can be combined.

Of these, phenoxy resins with a biphenyl skeleton and a bisphenol-S skeleton can be used. This will allow the glass transition temperature to be increased by means of the rigidity of the biphenyl skeleton, and will allow the adhesiveness of plated metal adhesion during the production of multi-layered circuit boards to be improved by means of the bisphenol-S skeleton.

Phenoxy resins with a bisphenol-A skeleton and bisphenol-F skeleton can also be used. This will allow the adhesion onto the inner layer circuit board during the production of multi-layered circuit boards to be improved. Phenoxy resins with the above biphenyl skeleton and bisphenol-S skeleton can be combined with phenoxy resins that have a bisphenol-A skeleton and bisphenol-F skeleton.

The molecular weight of the above film-forming resins is not particularly limited, but is preferably 1,000 to 100,000, and even more preferably 10,000 to 60,000.

A film-forming resin with a weight-average molecular weight under the above-mentioned lower limit may not be sufficiently effective to improve the film formability. A weight-average molecular weight over the above-mentioned upper limit may lower the solubility of the film-forming resin. Keeping the weight-average molecular weight of the film-forming resin within the above range can ensure that a good balance of properties will be obtained.

The content of the film-forming resin is not particularly limited, but is preferably 1 to 40 wt %, and more preferably 5 to 30 wt %, of the total of the resin composition. A film-forming resin content under the above-mentioned lower limit may be ineffective in improving the film formability, and a content over the above-mentioned upper limit may lower the effect in providing a low linear expansion, due to a correspondingly lower cyanate resin content. Keeping the content of the film-forming resin within the above range can ensure that a good balance of properties will be obtained.

The above thermosetting resin and film-forming resin used in the build-up layers are all preferably substantially free of halogen atoms. This will allow flame retardance to be provided without the use of a halogen compound. Here, "substantially free of halogen atoms" means, for example, that the content of halogen atoms in the epoxy resin or phenoxy resin is no more than 0.15 wt % (JPCA-ES01-2003).

A curing accelerator may also be used as needed in the resin composition. Well known curing accelerators can be used. Examples include organic metal salts such as imidazole compounds, zinc naphthenate, cobalt naphthenate, tin octylate, cobalt octylate, bis(acetylacetonato)cobalt (II), and tris(acetylacetonato)cobalt (III); tertiary amines such as triethylamine, tributylamine, and diazabicyclo[2,2,2]octane; phenol compounds such as phenol, bisphenol A, and nonylphenol; organic acids such as acetic acid, benzoic acid, salicylic acid, and para-toluenesulfonic acid; or mixtures thereof. One kind of such curing accelerators, including derivatives thereof, can be used alone, or two or more kinds of the curing accelerators may be combined, including derivatives thereof.

Among these curing accelerators imidazole compounds are particularly desirable. This can improve the solder heat resistance after moisture absorption. Such imidazole compounds are not particularly limited, but will preferably be miscible with the above-mentioned cyanate resin, epoxy resin, and film-forming resin components.

Here, "be miscible with the above-mentioned cyanate resin, epoxy resin, and film-forming resin components" means that the imidazole compound has a property of being substantially dissolved at the molecular level or being dispersed to a state close to it, when mixed with the above cyanate resin, epoxy resin, and film-forming resin components or when mixed with these components and an organic solvent.

Examples of imidazole compounds that may be used in the resin composition of the build-up layers include 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino-6-[2'-undecylimidazolyl]-ethyl-s-triazine, 2,4-diamino-6-[2'-ethyl-4-methylimidazolyl-(1')]-ethyl-s-triazine, 2-phenyl-4,5-dihydroxymethylimidazole, and 2-phenyl-4-methyl-5-hydroxymethylimidazole.

Of these, the imidazole is preferably selected from 1-benzyl-2-methylimidazole, 1-benzyl-2-phenylimidazole, and 2-ethyl-4-methylimidazole. These imidazole compounds have particularly good miscibility, and can therefore give cured products having a high uniformity and enable the formation of fine and uniform roughened surfaces, thus allowing fine conductor circuits to be readily formed and multi-layered circuit boards with high heat resistance to be produced. Such imidazole compounds can be used to effectively accelerate the reaction of the cyanate resin or epoxy resin and to provide equivalent properties even with smaller amounts of imidazole compounds.

Resin compositions in which such imidazole compounds have been used can be cured in a highly uniform manner from micro-matrix units between the resin components. This can improve the insulating properties and heat resistance of the build-up layers formed on the multi-layered circuit board.

The content of the imidazole compound is not particularly limited but is preferably 0.01 to 5 wt %, and preferably 0.05 to 3 wt %, relative to the total of the cyanate resin and epoxy resin. This will allow the heat resistance in particular to be improved.

The above resin composition will also preferably include an inorganic filler. This will provide the low linear expansion and flame retardance properties to be improved. The elastic modulus can be improved by combining the cyanate resin and/or pre-polymer thereof (especially Novolak-type cyanate resin) with the inorganic filler.

Examples of inorganic fillers include silicates such as talc, fired clay, unfired clay, mica, and glass, oxides such as titanium oxide, alumina, silica, and fused silica, carbonates such as calcium carbonate, magnesium carbonate, and hydrotalcite, hydroxides such as aluminum hydroxide, magnesium hydroxide, and calcium hydroxide, sulfates or sulfites such as barium sulfate, calcium sulfate, and calcium sulfite, borates such as zinc borate, barium meta-borate, aluminum borate, calcium borate, and sodium borate, nitrides such as aluminum nitride, boron nitride, silicon nitride, and carbon nitride, and titanates such as strontium titanate and barium titanate. These can be used as the inorganic filler either singly or in combination of two or more kinds. Of these, silica is preferred, and fused silica (particularly spherical fused silica) is desirable because of its low linear expansion. The configuration may be a pulverized or spherical form and a method suitable for the intended purpose is used, such as using spherical silica to lower the melt viscosity of the resin composition so that impregnation into the fiber base is ensured.

The mean particle diameter of the inorganic filler is not particularly limited, but is preferably 0.01 to 5.0 μm, and more preferably 0.1 to 2.0 μm.

An inorganic filler with a mean particle diameter over the above-mentioned lower limit may result in a higher resin varnish viscosity when the resin composition of the invention is used to prepare a resin varnish, and may thus affect workability when producing a build-up layer with a carrier base. A mean particle diameter over the above-mentioned upper limit, however, may result in precipitation or the like of the inorganic filler in the resin varnish. Keeping the mean particle diameter of the inorganic filler within the above range can ensure that a good balance of properties will be obtained.

The above inorganic filler material is not particularly limited, but an inorganic filler with a mono-disperse mean particle diameter can be used, as can an inorganic filler with a poly-disperse mean particle diameter. Inorganic fillers with a mono-disperse and/or poly-disperse mean particle diameter can be used either singly or in combinations of two or more kinds thereof.

The content of the inorganic filler is not particularly limited, but is preferably 20 to 70 wt %, and more preferably 30 to 60 wt % of the entire resin composition.

An inorganic filler content under the above-mentioned lower limit may lower the effect in providing a low linear expansion and low moisture absorption. A content over the above-mentioned upper limit may lower the fluidity of the resin composition and thus lower the formability of the build-up layers. Keeping the inorganic filler content within the above range can ensure that a good balance of properties will be obtained.

The resin composition is not particularly limited, but the use of a coupler is preferred. The couplers can improve the wettability in the interface between the above-mentioned thermosetting resin and inorganic filler so as to improve the heat resistance, particularly the solder heat resistance after moisture absorption.

As the above-mentioned couplers, commonly used couplers may be used. Specifically, one or more couplers selected from epoxy silane couplers, cationic silane couplers, amino silane couplers, titanate-type couplers, and silicone oil-type couplers will preferably be used. This can improve the wettability at the interface with the inorganic filler, thus increased heat resistance.

The coupler content is not particularly limited but is preferably 0.05 to 3.0 weight parts per 100 weight parts inorganic filler. A coupler content under the above-mentioned lower limit may not be effective in coating the inorganic filler and improving the heat resistance. A content above the above-mentioned upper limit, on the other hand, may lower the flexural strength of the build-up layers. Keeping the coupler content within the above range can ensure that a good balance of properties will be obtained.

In the above resin composition, there may be used one or more kinds of thermoplastic resins such as phenoxy resins, polyimide resins, polyamide-imide resins, polyphenylene oxide resins, polyether sulfone resins, polyester resins, polyethylene resins, polystyrene resins, thermoplastic elastomers such as polystyrene thermoplastic elastomers (such as styrene-butadiene copolymers, and styrene-isoprene copolymers), polyolefin thermoplastic elastomers, polyamide elastomers, and polyester elastomers, and diene elastomers such as polybutadiene, epoxy-modified polybutadiene, acrylic-modified polybutadiene, and methacrylic-modified polybutadiene.

Pigments, dyes, defoamers, leveling agents, UV absorbents, foaming agents, antioxidants, flame retardants, ion-capturing agents, and the like may be added as needed in addition to the above components to the resin composition.

The method for forming the resin composition on the carrier base is not particularly limited. Examples include methods in which the resin composition is dissolved and dispersed in a solvent or the like to prepare a resin varnish, which is then applied to the carrier base using any of various coating devices and then dried, and methods in which the resin varnish is sprayed onto the carrier base using a spraying device and is then dried.

Methods in which the resin varnish is applied to the carrier base using a coater such as a comma coater or die coater and is then dried are preferred. This will allow a build-up layer with a carrier base having a uniform build-up layer thickness to be efficiently produced without voids.

The carrier base is not particularly limited. Examples include polyester resins such as polyethylene terephthalate and polybutylene terephthalate, heat-resistant thermoplastic resin films such as fluororesins and polyimide resins, and metal foil such as copper and/or copper-based alloys, aluminum and/or aluminum-based alloys, iron and/or iron-based alloys, silver and/or silver-based alloys, gold and/or gold-based alloys, zinc and zinc-based alloys, nickel and nickel-based alloys, and tin and tin-based alloys.

The thickness of the carrier base is not particularly limited, although the use of one that is 10 to 100 μm is desirable in view of the good handleability when a build-up layer with a carrier base is produced.

The solvent used in the aforementioned resin varnish will preferably exhibit good solubility toward the resin components of the resin composition, but solvents exhibiting poor solubility may also be used, provided that no adverse effects will result. Examples of solvents exhibiting good solubility include acetone, methyl ethyl ketone, methyl isobutyl ketone, cyclohexanone, tetrahydrofuran, dimethyl formamide, dimethyl acetamide, dimethyl sulfoxide, ethylene glycol, cellosolve-type solvent, and carbitol-type solvent.

The solid content in the resin varnish is not particularly limited, but is preferably 30 to 80 wt %, and more preferably 40 to 70 wt %.

The use of an oxidant such as a permanganate or bichromate for roughening treatment of the surface of a build-up layer formed from such a resin composition will allow lots of highly uniform fine concavities and convexities to be formed on the surface of the build-up layer after the roughening treatment.

Metal plating of the surface of the thus roughened build-up layer will allow fine conductor circuits to be accurately formed because of the highly smooth surface resulting from the roughened surface. The fine concavo-convex texturing can also enhance the anchoring effect and can bring about higher adhesion between the build-up layer and plating metal.

The thickness of the build-up layer formed from the resin composition is not particularly limited but is preferably 5 to 100 μm, and more preferably 10 to 80 μm. This will allow the concavities and convexities on the inner layer circuitry to be filled when a multi-layered circuit board is produced using these build-up layers, ensuring a suitable build-up layer thickness.

<Production of Multi-Layered Circuit Board>

Through holes 7 are formed in the material used for the core layer 5 noted above, and the surfaces are then copper plated, including the inner surfaces of the through holes, to form a conductor layer with the desired pattern, thereby producing the inner layer wiring board. The inner layer wiring board may itself serve as a multi-layered wiring board.

FIG. 1 illustrates a structure with three build-up layers stacked on both side of the inner layer wiring board. That is, a first build-up layer 6a, second build-up layer 6b, and third build-up layer 6c are stacked up on one surface (element mounting side) of the inner layer wiring board. The same is done on the other side of the inner layer wiring board. The number of the build-up layers 6 is not limited to this, and can be suitably designed according to the number of signal wires, wiring pattern, or the like. Another possible option is to form the build-up layers 6 on only one side of the inner layer wiring board.

The above build-up layers 6 are formed by placing the build-up layers on one or both sides of the inner layer wiring board and hot forming the material. Specifically, the build-up layers 6 and the inner layer wiring board are aligned, hot press forming is brought about in a vacuum using a vacuum pressure type of laminator, and the material is heated and cured by a hot air dryer or the like.

The conditions of the hot press forming are not particularly limited, but as an example, the temperature can be 60 to 160° C. and the pressure can be 0.2 to 3 MPa. The heat curing conditions are not particularly limited, but the temperature can be 140 to 240° C., and the time can be 30 to 120 minutes. The insulating resin of the above build-up layers 6 can also be placed on the inner layer wiring board and hot-press formed using a flat press device or the like. The hot press forming conditions are not particularly limited, but as an example, the temperature can be 140 to 240° C., and the pressure can be 1 to 4 MPa.

The plurality of build-up layers 6 have a wiring layer (conductor layer) 11. The multi-layered wiring structure with the plurality of build-up layers 6 is formed by the sequential stacking of build-up layers 6 and wiring layers 11 and the electrical connections by the stacked vias 8 between the wiring layers 11. An additive method such as a semi-additive or full additive method can be employed in the process for forming the build-up layers 6. In the additive method, after the formation of the build-up layers 6 on both sides of the internal wiring board, via holes can be formed in the build-up layers 6 by a laser process, for example. The stacked vias 8 and wiring layers 11 can be formed on the surface of the build-up layers 6, including the interior of the via holes, by sequential electroless copper plating and electrolytic copper plating, for example. After the electroless plating process, the adhesion between the build-up layer material and the copper can be improved by heat-treating. The process for forming the build-up layers 6 and wiring layers 11 (including the stacked vias 8) is repeated several times according to the lamination number of layers.

Electrode pads 12 connected to the inner wiring formed by the wiring layers 11, stacked vias 8, and through holes 7 are formed on the semiconductor element-mounting side of the circuit board 1 having the above build-up layers 6. Meanwhile, external connection terminals 9 connected to the inner wiring are formed on the side of the circuit board 1 opposite the surface on which the semiconductor elements are mounted. The electrode pads 12 and the external connector terminals 9 are electrically connected through the inner wiring including the wiring layers 11, stacked vias 8, and through holes 7. Metal terminals such as solder bumps or Au bumps are used for the external connector terminals 9.

<Semiconductor Package>

The flip-chip semiconductor package in FIG. 1 will be described next.

This embodiment of the invention includes a joining step for flip chip-joining the electrode surface of the semiconductor element 2 and the electrode surface of the circuit board 1 that is connected to the semiconductor element, and a sealing step for injecting a sealing resin composition 4 between the circuit board 1 and semiconductor element 2 to form an underfill.

In the sealing step, as the sealing resin composition 4 and the semiconductor package (flip chip-joined circuit board 1 and semiconductor element 2) which is not yet filled with the sealing resin composition 4 are heated, the sealing resin composition 4 is applied to the side edge of the semiconductor element 2 and crosses over into the gaps due to the capillary phenomenon, and a method may be employed to shorten the production cycle, such as tilting the semiconductor packages or making use of the pressure differential to accelerate injection.

When the sealing resin composition 4 has been injected/applied in this manner, the sealing resin composition 4 can be cured by being heated for 1 to 12 hours at a temperature ranging from 100° C. to 170° C. Here, the curing temperature profile may be varied. For example, the material may be thermally cured as the temperature is changed in stages, such as 1 hour of heating at 100° C. followed by 2 hours at 150° C.

The viscosity of the sealing resin composition 4 for forming the sealing resin composition 4 is preferably no more than 50 Pa·sec (25° C.). The circuit board 1 is similarly selected from those having the properties described above in the above embodiment of the semiconductor package.

The viscosity of the sealing resin composition 4 when the sealing resin composition 4 is injected will preferably be no more than 2 Pa·sec. The injection temperature is 60 to 140° C., and preferably 100 to 120° C. In the above embodiment, the properties of the sealing resin composition 4 and the properties of the circuit board 1 are adjusted to help lower the stress, but the adjustment of the properties of the sealing resin composition 4 and the properties of the circuit board 1 is arbitrarily made.

EXAMPLES

The invention is further illustrated by, but is not limited to, the following examples.

1. Test of Physical Properties of Sealing Resin Composition

Sealing resin compositions a through f were prepared.

Table 1 shows the measured results for the composition, glass transition temperature, coefficient of linear expansion, flexural elastic modulus, and viscosity of the sealing resin compositions. The blending amounts are in weight parts.

The glass transition temperature was determined by curing the sealing resin composition for 120 minutes at 150° C., cutting the composition into test pieces measuring 5×5×10 mm, and measuring the test pieces under a compression load of 5 g at a heating rate of 10° C./minute in a temperature range of from −100° C. to 300° C. using a TMA/SS120 mfd. by Seiko Instruments Inc. The coefficient of linear expansion was determined in the same way.

The flexural elastic modulus was determined by curing the sealing resin composition for 120 minutes in an oven heated at 150° C., then forming the composition to a width of 10 mm, a length of about 150 mm, and a thickness of 4 mm, then taking measurements with a Tensilon tester in 3-point bending mode in an atmosphere at 25° C. at a rate of 1 mm/min using a span of 64 mm, and calculating the elastic modulus from the initial gradient of the resulting stress-strain curve, giving the flexural elastic modulus.

The viscosity at 25° C. was determined at 5 rpm with a cone mounted on a Brookfield viscometer. The viscosity at 110° C. was determined at 1 Hz using a RheoStress RS150 rheometer fitted with a PP-50 cone and plate, mfd. by HAAKE.

TABLE 1

| Item | Generic name | Tradename | Sealing resin composition a | Sealing resin composition b | Sealing resin composition c | Sealing resin composition d | Sealing resin composition e | Sealing resin composition f |
| --- | --- | --- | --- | --- | --- | --- | --- | --- |
| Epoxy resin | bisphenol F-type epoxy resin | EXA-830 LVP | 100 | 65 | 100 | 0 | 65 | 65 |
| | trifunctional glycidylamine | E-630 | 0 | 35 | 0 | 100 | 35 | 35 |
| Curing agent | aromatic primary amine curing agent | Kayahard AA | 36 | 46 | 32 | 72 | 46 | 46 |
| Silane coupler | epoxy silane coupler | KBM-403 | 5 | 5 | 5 | 5 | 7 | 5 |
| Additives | stress-lowering agent | E-1800-6.5 | 5 | 5 | 5 | 5 | 5 | 5 |
| | diluent | DGME | 2 | 2 | 2 | 2 | 2 | 2 |

TABLE 1-continued

| Item | Generic name | Tradename | Sealing resin composition a | Sealing resin composition b | Sealing resin composition c | Sealing resin composition d | Sealing resin composition e | Sealing resin composition f |
|---|---|---|---|---|---|---|---|---|
| Filler | spherical synthetic silica | Adomatechs | 222 | 293 | 215 | 342 | 632 | 158 |
| Properties | filler content | | 60% | 65% | 60% | 65% | 80% | 50% |
| | glass transition temp (° C.) | | 70 | 95 | 55 | 155 | 95 | 95 |
| | coefficient of linear expansion (ppm/° C.) | | 32 | 24 | 32 | 24 | 15 | 41 |
| | Flexural elastic modulus (GPa: 25° C.) | | 9 | 10 | 9 | 10 | 15 | 7 |
| | viscosity (25° C.) (Pa · sec) | | 13 | 25 | 12 | 15 | 100 | 4 |

EXA-830 LVP: mfd. by Dainippon Ink Chemicals Inc., epoxy equivalent: 161

E-630: mfd. by Japan Epoxy Resins Co., Ltd., N,N-bis(2,3-epoxypropyl)-4-(2,3-epoxypropoxy)aniline, epoxy equivalent: 97.5

Kayahard AA: mfd. by Nippon Kayaku Co., Ltd., 3,3'-diethyl-4,4'-diaminophenylmethane, amine equivalent: 63.5

KBM-403: mfd. by Shin-Etsu Chemical Co., Ltd., 3-glycidoxypropyltrimethoxysilane, molecular weight: 236.3, theoretical coverage: 330 $m^2/g$ E-1800-6.5 (epoxy-modified polybutadiene): mfd. by Nippon Oil Corp., E-1800-6.5, number-average molecular weight: 1800, epoxy equivalent: 250

DGME: reagent, diethylene glycol monoethyl ether: mfd. by Wako Pure Ind., Ltd.

Adomatechs: mfd. by Adomatechs Co., Ltd., 45:40:15 blend of synthetic spherical silica SE-6200 (mean particle diameter: 2.5 μm), SO-E3 (mean particle diameter: 1 μm), and SO-E2 (mean particle diameter: 0.5 μm) (only SE-6200 used for sealing resin composition e)

2. Test of Physical Properties of Cured Material Used for Build-Up Layer

The following Material 1, ABF-GX13 and FBR-EX-60 were used as materials for the build-up layers.

(1) Preparation of Resin Varnish 25 weight parts of Novolak-type cyanate resin (mfd. by Lonza Japan Ltd., Primaset PT-30, weight average molecular weight: about 700), 24.7 weight parts of biphenyl dimethylene-type epoxy resin (mfd. by Nippon Kayaku Co., Ltd., NC-3000, epoxy equivalent: 275, weight average molecular weight: 2000), 10 weight parts of copolymer of phenoxy resin/biphenyl epoxy resin and bisphenol-S epoxy resin, with epoxy groups at terminals (mfd. by Japan Epoxy Resin Co., Ltd., YX-8100H30, weight average molecular weight: 30000), and 0.1 weight part of imidazole compound (mfd. by Shikoku Chemicals Corp., Curasol 1B2PZ (1-benzyl-2-phenylimidazole)) were dissolved and dispersed in methyl ethyl ketone. 40 weight parts inorganic filler/spherical fused silica (mfd. by Adomatechs Co., Ltd., SO-25R, mean particle diameter: 0.5 μm) and 0.2 weight part of coupler/epoxy silane coupler (mfd. by GE Toshiba Silicone Co., Ltd., A-187) were added, and the ingredients were stirred for 10 minutes using a high speed stirring device to prepare a resin varnish with a 50 wt % solids content.

(2) Preparation of Material Used for Build-Up Layers

The resin varnish obtained above was applied using a comma coater to one side of a 25 μm thick PET (polyethylene terephthalate) film so as to provide a dried resin layer thickness of 60 μm, and was dried for 10 min in a 160° C. dryer to prepare the material (Material 1) used for the build-up layers.

Two layers of each material used for the build-up layers were laminated using an ordinary pressure laminator to produce an 80 μm thick insulating layer. In the case of Material 1, the material was cured for 2 hours at 200° C., and in the cases of ABF-GX13 and FBR-EX-60, the respective-materials were cured for 2 hours at 180° C. Table 2 shows the measures results for the glass transition temperature, coefficient of linear expansion, and elastic modulus for each material used for the build-up layer.

[Glass Transition Temperature and Elastic Modulus]

5 mm×30 mm test pieces taken from the resulting cured resin products were used as evaluation samples.

The dynamic viscoelasticity was measured by applying strain (10 Hz frequency) at a heating rate of 5° C./min using a dynamic mechanical analyzer (DMA) (mfd. by Seiko Instruments Inc., DMS6100), the glass transition temperature (Tg) was determined from the tan δ peak value, and the elastic modulus at 25° C. and 250° C. were determined from the resulting measurements.

[Glass Transition Temperature and Coefficient of Linear Expansion]

4 mm×20 mm evaluation samples from the above cured resin products were used.

A TMA device (TMA) (mfd. by TA Instruments Co., Ltd.) was used to conduct measurements at a heating rate of 10° C./min. α1 is the coefficient of linear expansion up to the glass transition temperature, and α2 is the coefficient of linear expansion over the glass transition temperature.

TABLE 2

| Build-up layer | | Material 1 | ABF-GX13 | FBR-EX-60 |
|---|---|---|---|---|
| glass transition temperature (TMA) | (° C.) | 180 | 165 | 165 |
| glass transition temperature (DMA) | (° C.) | 240 | 190 | 190 |
| coefficient of linear expansion (x, y) | α1 (ppm) | 30 | 46 | 36 |
| | α2 (ppm) | 90 | 120 | 71 |
| elastic modulus | 25° C. (GPa) | 13 | 4 | 4 |
| | 250° C. (GPa) | 0.8 | 0 | 0 |

3. Test of Physical Properties of Cured Product of the Material Used for Core Layer HL832HS Type HS was used as the material for the core layer. Copper foil on 0.4 mm thick double-sided boards was etched off. The glass transition temperature, coefficient of linear expansion, and elastic modulus of the material used for the core layer are given in Table 3.

[Glass Transition Temperature and Elastic Modulus]

5 mm×30 mm test pieces from the cured resin product obtained above were used as evaluation samples.

The dynamic viscoelasticity was measured by applying strain (10 Hz frequency) at a heating rate of 5° C./min using a dynamic mechanical analyzer (DMA) (mfd. by Seiko Instruments Inc., DMS6100), the glass transition temperature (Tg) was determined from the tan δ peak value, and the elastic modulus at 25° C. was determined from the resulting measurements.

[Glass Transition Temperature and Coefficient of Linear Expansion]

4 mm×20 mm evaluation samples from the cured resin product obtained above were used.

Measurements were conducted at a heating rate of 10° C./minute using a TMA device (TMA) (mfd. by TA Instruments Co., Ltd.). α1 is the coefficient of linear expansion up to the glass transition temperature.

TABLE 3

| Core layer | | HL832HS-Type HS |
|---|---|---|
| glass transition temperature (TMA) | (° C.) | 185 |
| glass transition temperature (DMA) | (° C.) | 215 |
| coefficient of linear expansion (X direction) | α1 (ppm) | 14 |
| Elastic modulus (vertical direction) | 25° C. (GPa) | 29 |

4. Inner Layer Structure of Circuit Board

The material used for the build-up layers and the material used for the core layer were used to produce a multi-layered circuit board for evaluation by the semi-additive method. The evaluation multi-layered circuit board was an 8-layer board in which 3 build-up layers were laminated on both sides of the core layer. The inner layer wiring had an inner layer structure in which the core layer had through holes, 3-stage stacked vias were arranged on both sides of the through holes, and electrode pads on the semiconductor element mounting surface and stacked vias formed on both sides of the through holes were directly connected.

5. Semiconductor Package Reliability Test: Reflow Resistance Test and Heat Cycle Test The above sealing resin compositions a through f, circuit boards A through E (circuit board A in Comparative Examples 1 and 2, circuit board B in Comparative Example 3, circuit board C in Examples 1 and 2, circuit board D in Comparative Examples 4 to 7 and Examples 3, and circuit board E in Comparative Example 8), silicon chips, and solder balls as metal bumps were used to prepare semiconductor packages (number of bumps: 484) by flip-chip mounting with the combinations given in Table 4. Comparative Examples 1 through 8 and Examples 1 through 3 were evaluated under the following conditions. The compositions of circuit boards A through E are given below.

Circuit Board A: 50 mm×50 mm size, 0.7 mm thick (690 μm), 8 circuit layers.

The inner layer structure of the board was a structure in which, as shown in FIG. 1, stacked vias were arranged on both sides on the through holes of the core layer. (Core layer material: mfd. by Mitsubishi Gas Chemical Co., Inc., HL832HS Type HS, 0.4 mm thick; build-up layer: mfd. by Ajinomoto Co., Inc., ABF-TGX13, 40 μm thick, SR layer at the top and bottom faces: 25 μm)

Circuit Board B: 50 mm×50 mm size, 0.7 mm thick (690 μm), 8 circuit layers.

Figure 2:
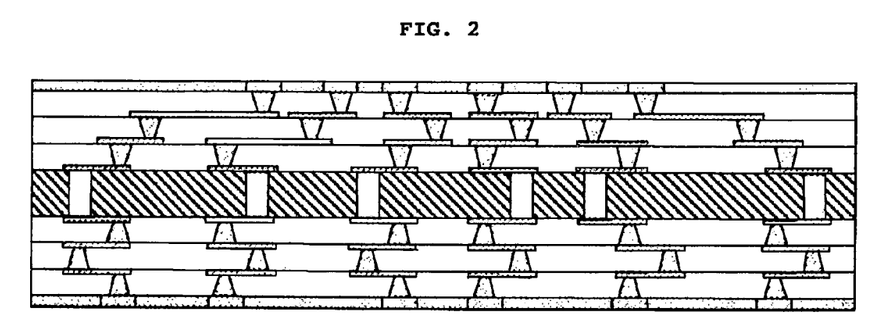
FIG. 2 A cross sectional view of the structure in the Comparative Examples which have no stacked vias arranged on both sides of the through holes of the core layer.

The inner layer structure of the board was a structure in which, as shown in FIG. 2, stacked vias were not arranged on both sides on the through holes of the core layer. (Core layer material: mfd. by Mitsubishi Gas Chemical Co., Inc., HL832HS Type HS, 0.4 mm thick; build-up layer: Material 1, 40 μm thick, SR layer at the top and bottom faces: 25 μm)

Circuit Board C: 50 mm×50 mm size, 0.7 mm thick (690 μm), 8 circuit layers.

The inner layer structure of the board was a structure in which, as shown in FIG. 1, stacked vias were arranged on both sides on the through holes of the core layer. (Core layer material: mfd. by Mitsubishi Gas Chemical Co., Inc., HL832HS Type HS, 0.4 mm thick; build-up layer: Material 1, 40 μm thick, SR layer at the top and bottom faces: 25 μm)

Circuit Board D: 50 mm×50 mm size, 0.7 mm thick (690 μm), 8 circuit layers.

Figure 3:
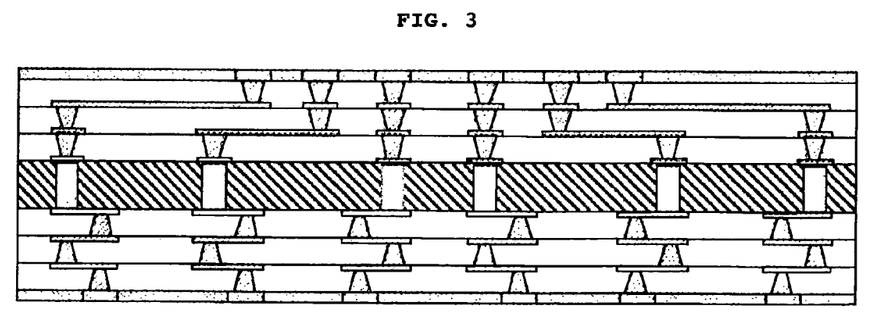
FIG. 3 A cross sectional view of the structure in the Examples which have stacked vias arranged on the through holes of the core layer on the surface side for mounting a semiconductor element.

The inner layer structure of the board was a structure in which, as shown in FIG. 3, stacked vias were arranged on part of the through holes of the core layer at the side on which the semiconductor elements are mounted. (Core layer material: mfd. by Mitsubishi Gas Chemical Co., Inc., HL832HS Type HS, 0.4 mm thick; build-up layer: Material 1, 40 μm thick, SR layer at the top and bottom faces: 25 μm)

Circuit Board E: 50 mm×50 mm size, 0.7 mm thick (690 μm), 8 circuit layers.

The inner layer structure of the board was a structure in which, as shown in FIG. 3, stacked vias were arranged on part of the through holes of the core layer at the side on which the semiconductor elements are mounted. (Core layer material: mfd. by Mitsubishi Gas Chemical Co., Inc., HL832HS Type HS, 0.4 mm thick; build-up layer: mfd. by Tamura Kaken Corp., FBR-EX-62, 40 μm thick, SR layer at the top and bottom faces: 25 μm)

A pretreatment was carried out for 192 hours at 30° C. and 60%, a reflow resistance test (conducted 3 times at a peak temperature of 260° C.) and a heat cycle test (−55° C. (30 min)/125° C. (30 min), 500 cycles) were conducted, and the bump connections and connections inside the board were evaluated by a conduction resistance test. Areas where a 5% increase in resistance from the initial resistance was found were considered defects to calculate the defect rate (=number of defect areas/number of initial evaluated areas). Table 4 shows the results of the evaluation and the length of the wiring from the pads connected to the solder bumps near the chip center to the external output terminals. The inductance was also determined in parts where the wiring length was measured. O indicates good results, and A indicates a two-fold or greater deterioration relative to the value of Example 1.

TABLE 4

| | circuit board | stacked via arrangement | wiring length (μm) | build up layer | sealing resin composition | bump defect rate | defect rate inside circuit board | inductance |
|---|---|---|---|---|---|---|---|---|
| Comparative Example 1 | A | both sides of core layer | 640 | ABF-GX13 | a | 30% | 62% | — |
| Comparative Example 2 | A | both sides of core layer | 640 | ABF-GX13 | b | 0% | 62% | — |
| Comparative Example 3 | B | None | 1840 | Material 1 | a | 0% | 0% | Δ |
| Comparative Example 4 | D | one side of core layer | 1240 | Material 1 | c | 100% | 0% | Δ |
| Comparative Example 5 | D | one side of core layer | 1240 | Material 1 | d | 0% | 50% | — |
| Comparative Example 6 | D | one side of core layer | 1240 | Material 1 | e | 0% | 0% | Δ |
| Comparative Example 7 | D | one side of core layer | 1240 | Material 1 | f | 30% | 0% | Δ |
| Comparative Example 8 | E | one side of core layer | 1240 | FBR-EX-62 | a | 30% | 30% | Δ |
| Example 1 | C | both sides of core layer | 640 | Material 1 | a | 13% | 0% | ○ |
| Example 2 | C | both sides of core layer | 640 | Material 1 | b | 0% | 0% | ○ |
| Example 3 | D | one side of core layer | 1240 | Material 1 | a | 0% | 0% | ○ |

—: Measurements could not be made because of defects inside circuit board.

The above test results show that structures with lower stress between the structural members could be produced by optimizing the properties of the build-up layers and sealing resin composition, and that highly reliable flip-chip semiconductor packages with no cracks in the bumps and no connection defects inside the circuit board could be obtained when multi-layered circuit boards with stacked vias were used. Increasing the number of build-up layers in which stacked vias are arranged on the through holes of the core layer was also effective in shortening the connection wiring length and lowering inductance.

Comparative Example 3 in particular confirmed that inductance increased as a result of wiring length because of the absence of stacked vias in the build-up layers.

| | DESCRIPTION OF SYMBOLS |
|---|---|
| 1 | CIRCUIT BOARD |
| 2 | SEMICONDUCTOR ELEMENTS |
| 3 | SOLDER BALLS |
| 4 | SEALING RESIN COMPOSITION |
| 5 | CORE LAYER |
| 6 | BUILD-UP LAYERS |
| 6a | FIRST BUILD-UP LAYER |
| 6b | SECOND BUILD-UP LAYER |
| 6c | THIRD BUILD-UP LAYER |
| 7 | THROUGH HOLES |
| 8 | STACKED VIAS |
| 9 | EXTERNAL CONNECTION TERMINAL |
| 11 | WIRING LAYER |
| 12 | ELECTRODE PADS |

The invention claimed is:

1. A connecting structure for a flip-chip semiconductor package, comprising:
   a circuit board having a core layer and at least one build-up layer;
   a semiconductor element connected via metal bumps to the circuit board; and
   a sealing resin composition with which gaps between the semiconductor element and circuit board is filled,
   wherein a cured product of the sealing resin composition has a glass transition temperature between 60° C. and 150° C. and a coefficient of linear expansion from room temperature to the glass transition temperature being between 15 ppm/° C. and 35 ppm/° C.,
   a cured product of the build-up layer has a glass transition temperature of at least 170° C. and a coefficient of linear expansion in the in-plane direction up to the glass transition temperature being not more than 40 ppm/° C., and
   stacked vias are provided in the build-up layer on at least one side of the core layer.

2. The connecting structure for a flip-chip semiconductor package according to claim 1, wherein a resin part of the build-up layer comprises a resin composition including at least one kind selected from the group consisting of epoxy resins, phenol resins, cyanate resins, triazine resins, bismaleimide resins, polyimide resins, polyamide-imide resins, and benzocyclobutene resins.

3. The connecting structure for a flip-chip semiconductor package according to claim 1, comprising build-up layers having stacked vias on both sides of the core layer.

4. The connecting structure for a flip-chip semiconductor package according to claim 1, wherein the core layer has through holes.

5. The connecting structure for a flip-chip semiconductor package according to claim 1, wherein the core layer has through holes layer and the through holes and the semiconductor element are connected through the stacked vias of the build-up layer.

6. The connecting structure for a flip-chip semiconductor package according to claim 1, wherein the stacked vias of the build-up layer are formed on the through holes of the core layer, and the semiconductor element and circuit board are connected by metal bumps through the stacked vias.

7. The connecting structure for a flip-chip semiconductor package according to claim 1, wherein the sealing resin composition comprises at least one epoxy resin, and further comprises a curing agent, silane coupler, and inorganic filler.

8. The connecting structure for a flip-chip semiconductor package according to claim 1, wherein the sealing resin composition has a viscosity of not more than 50 Pa·sec (25° C.).

9. A build-up layer material, characterized by being used in the connecting structure for a flip-chip semiconductor package according to claim 1.

10. A sealing resin composition, characterized by being used in the connecting structure for a flip-chip semiconductor package according to claim 1.

11. A circuit board, characterized by being used in the connecting structure for a flip-chip semiconductor package according to claim 1.

* * * * *